US008643407B2

(12) United States Patent
Reese et al.

(10) Patent No.: US 8,643,407 B2
(45) Date of Patent: Feb. 4, 2014

(54) HIGH TEMPERATURE HALF BRIDGE GATE DRIVER

(76) Inventors: Brad Alan Reese, Fayetteville, AR (US); Javier Antonio Valle-Mayorga, Plano, TX (US); Ivonne Escorcia-Carranza, Glasgow (GB); Khoa Minh Phan, Fort Worth, TX (US); Caleb Paul Gutshall, Fayetteville, AR (US); Roberto Marcelo Schupbach, Fayetteville, AR (US)

( * ) Notice: Subject to any disclaimer, the term of this patent is extended or adjusted under 35 U.S.C. 154(b) by 0 days.

(21) Appl. No.: 13/530,352

(22) Filed: Jun. 22, 2012

(65) Prior Publication Data

US 2013/0009674 A1    Jan. 10, 2013

Related U.S. Application Data

(60) Provisional application No. 61/571,206, filed on Jun. 22, 2011.

(51) Int. Cl.
*H03B 1/00*    (2006.01)
*H03K 3/00*    (2006.01)

(52) U.S. Cl.
USPC ............................. 327/109; 327/108; 327/112

(58) Field of Classification Search
USPC ......................................... 327/108, 109, 112
See application file for complete search history.

(56) References Cited

U.S. PATENT DOCUMENTS

| | | | |
|---|---|---|---|
| 6,556,053 B2 | 4/2003 | Stanley | 327/108 |
| 7,436,160 B2 | 10/2008 | Rusu et al. | 323/284 |
| 7,688,049 B2 | 3/2010 | Iwabuchi et al. | 323/271 |
| 7,777,370 B2 | 8/2010 | Kojori et al. | 307/129 |
| 7,796,076 B2 | 9/2010 | Melanson | 341/155 |
| 7,804,697 B2 | 9/2010 | Melanson | 363/34 |
| 7,965,522 B1 | 6/2011 | Hornberger et al. | 363/21.1 |
| 2009/0147544 A1 * | 6/2009 | Melanson | 363/21.01 |

OTHER PUBLICATIONS

UC1724/2724/3724, 1999, Isolated Drive Transmitter UC1724/2724/3724. Texas Instruments Inc., 1999.

* cited by examiner

*Primary Examiner* — John Poos
(74) *Attorney, Agent, or Firm* — Keisling & Pieper PLC; David B. Pieper

(57) ABSTRACT

A half bridge gate driving circuit for providing gate driving circuits in a bi-hecto celcius (200 degrees celcius) operating environment having multiple functions including combinations of multiple level logic inputs, noise immunity, fault protection, overlap protection, pulse modulation, high-frequency modulation with transformer based isolation, high-frequency demodulation back to pulse width modulation, deadtime generator, level shifter for high side transistor, overcurrent protection, and undervoltage lockout.

9 Claims, 24 Drawing Sheets

HIGH TEMPERATURE HALF BRIDGE GATE DRIVER

CROSS-REFERENCE TO RELATED APPLICATIONS

This application claims priority of U.S. Patent Application 61/571,206, filed Jun 6, 2011 entitled HIGH TEMPERATURE HALF BRIDGE GATE DRIVER, which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in gate driving circuits. More particularly, the invention relates to improvements particularly suited for providing gate driving circuits in a bi-hecto celcius (200 degrees celcius) operating environment having multiple functions including combinations of multiple level logic inputs, noise immunity, fault protection, overlap protection, pulse modulation, high-frequency modulation with transformer based isolation, high-frequency demodulation back to pulse width modulation, deadtime generator, level shifter for high side transistor, over-current protection, and undervoltage lockout. In particular, the present invention relates a single circuit providing all of this functionality in a compact robust package.

2. Description of the Known Art

As will be appreciated by those skilled in the art, half bridge gate drivers are known in various forms. Patents disclosing information relevant to bird guards include: U.S. Pat. No. 6,556,053, issued to Stanley on Apr. 29, 2003 entitled Half-bridge gate driver optimized for hard-switching; U.S. Pat. No. 7,436,160, issued to Rusu, et al. on Oct. 14, 2008 entitled Half bridge adaptive dead time circuit and method; U.S. Pat. No. 7,688,049, issued to Iwabuchi, et al. on Mar. 30, 2010 entitled Level shift circuit and power supply device; and U.S. Pat. No. 7,965,522, issued to Hornberger, et al. on Jun. 21, 2011 entitled Low-loss noise-resistant high-temperature gate driver circuits. Each of these patents is hereby expressly incorporated by reference in their entirety.

U.S. Pat. No. 6,556,053, issued to Stanley on Apr. 29, 2003 entitled Half-bridge gate driver optimized for hard-switching discusses its abstract as follows: A half-bridge gate driver circuit including two separate floating high-side driver circuits for operating a switch circuit having a high-side switch and a low-side switch. Each of the driver circuits include input control logic which is referenced to a supply signal with a potential that becomes negative relative to the negative common terminal of the switches, thereby enhancing the operation of the switch circuit. The circuit may further include signal translation stages for translating control signals to the control logic of the driver circuits. The signal translation stages include a plurality of cascoded parasitic transistors which provide a neutralizing capacitance to minimize noise.

U.S. Pat. No. 7,436,160, issued to Rusu, et al. on Oct. 14, 2008 entitled Half bridge adaptive dead time circuit and method describes its abstract as follows: A high voltage offset detection circuit registers the voltage at the midpoint of a switching half-bridge and may determine when the midpoint voltage reaches a given value to avoid hard-switching in the half-bridge switches. The midpoint voltage of the switching half-bridge is applied through a buffer to a MOSFET that is current limited to produce a voltage that reflects the voltage of the midpoint of the switching half-bridge. The voltage produced by the MOSFET may be supplied to a comparator with a threshold input to obtain a signal that indicates when the switches of the switching half-bridge may be turned on to avoid hard-switching. An adaptive dead-time circuit and method may comprise the above sensing circuit, a first circuit for generating a first signal indicative of a high to low transition of the midpoint voltage; and an output circuit for generating an adaptive dead-time output signal based thereon. A second circuit may generate a second signal indicative of a low to high transition of the voltage; wherein the output circuit generates the adaptive dead-time output signal based on both the first and second signals. The second circuit preferably generates the second signal by reproducing the first signal. The first circuit may generate the first signal by charging a capacitor in response to pulses, and the second circuit may generate the second signal by charging a second capacitor corresponding to said first capacitor, and the adaptive dead-time output signal may be responsive to the charges on the first and second capacitors.

U.S. Pat. No. 7,688,049, issued to Iwabuchi, et al. on Mar. 30, 2010 entitled Level shift circuit and power supply device describes its abstract as: In a level shift circuit including: an inverter circuit having a series circuit of a Pch-type transistor and an Nch-type transistor, which re connected between electrodes of a floating power supply; and a transistor Q1 in which a drain terminal and a source terminal are connected between an input terminal of the inverter circuit and a ground, wherein a drain terminal and source terminal of a transistor Q2 are connected between one terminal of the floating power supply and the drain of the transistor Q1, and a drain terminal and source terminal of a transistor Q3 are connected between a control terminal of the transistor Q2 and the ground.

U.S. Pat. No. 7,965,522, issued to Hornberger, et al. on Jun. 21, 2011 entitled Low-loss noise-resistant high-temperature gate driver circuits describes its abstract as: High temperature gate driving circuits with improved noise resistance and minimized loss are implemented with high temperature components with a reduced size magnetic isolation transformer. Input broad-pulse width modulated signals are converted to offsetting narrow pulses to cross the reduced size magnetic transformer minimizing isolation losses. One embodiment teaches time and voltage offset narrow single pulses that control a set and reset regeneration of the pulse width output on the secondary side of the transformer. Another embodiment teaches multiple concurrent voltage offset pulses to cross the transformer and charge a threshold capacitor for both filtering noise and controlling the pulse width regeneration on the secondary side of the transformer.

From these prior references it may be seen that these prior art patents are very limited in their teaching and utilization, and an improved half bridge gate driver is needed to overcome these limitations.

SUMMARY OF THE INVENTION

The present invention is directed to an improved half bridge gate driver using high temperature components. In accordance with one exemplary embodiment of the present invention, a half bridge gate driver is provided using multiple level logic inputs, noise immunity, fault protection, overlap protection, pulse modulation, high-frequency modulation with transformer based isolation, high-frequency demodulation back to pulse width modulation, deadtime generator, level shifter for high side transistor, overcurrent protection, and undervoltage lockout. Of particular note is the construction of modulation circuits adaptable to different modulations, the use of current starved inverters, and delay circuit integration. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
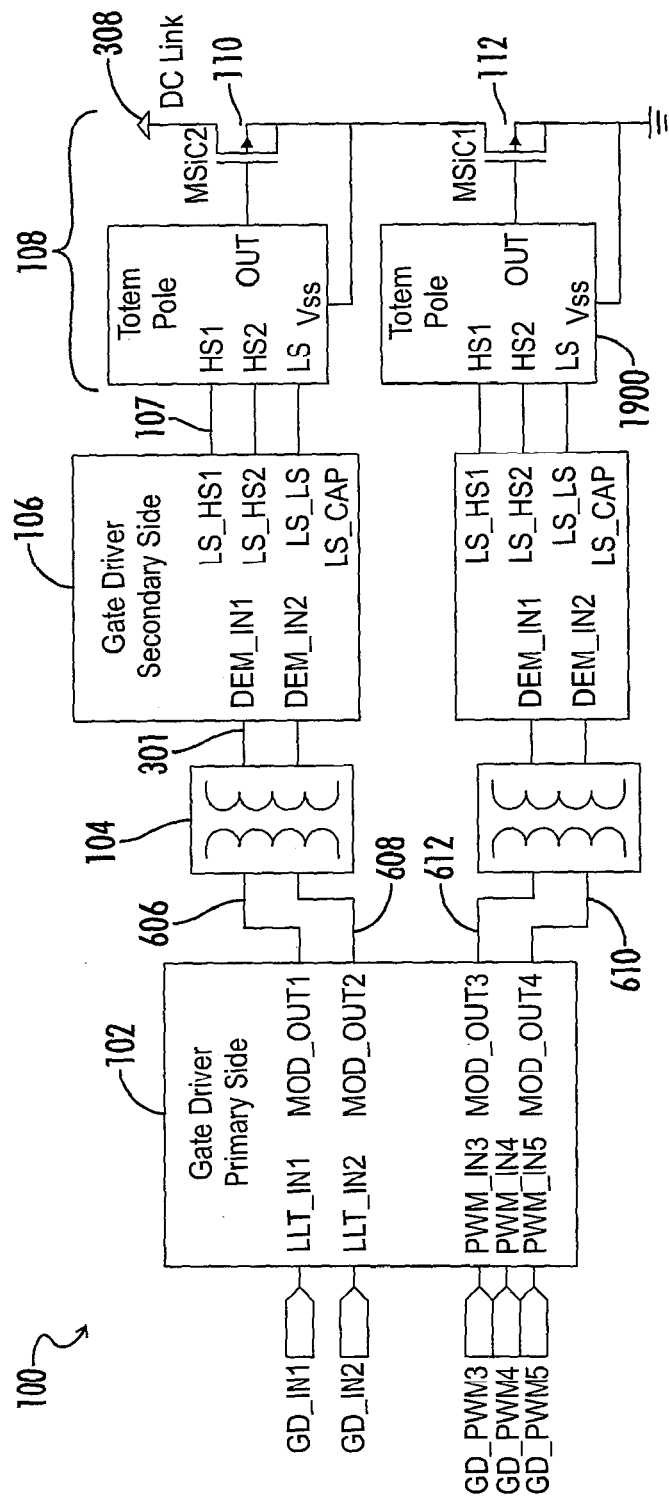
FIG. 1 is an HTSOI ASIC block diagram.

As shown in FIG. 1 of the drawings, one exemplary embodiment of the present invention is generally shown as a high temperature silicon on insulator (HTSOI) application specific integrated circuit (ASIC) gate driver 100. This HTSOI ASIC gate drive 100 is an isolated gate driver capable of driving the upper and lower power transistors of a half-bridge configuration power circuit. This ASIC gate driver 100 is based on APEI, Inc.'s discrete gate driver technology (U.S. Pat. No. 7,965,522), although some of the blocks are implemented differently. The ASIC gate driver 100 consists of a primary side block 102 and secondary side block 106 electrically isolated by a transformer 104, with the secondary side block 106 outputting to a totem pole output 108 as shown in FIG. 1. In addition, protection circuitry and a pulse width modulation (PWM) generator are integrated into the ASIC.

Figure 2:
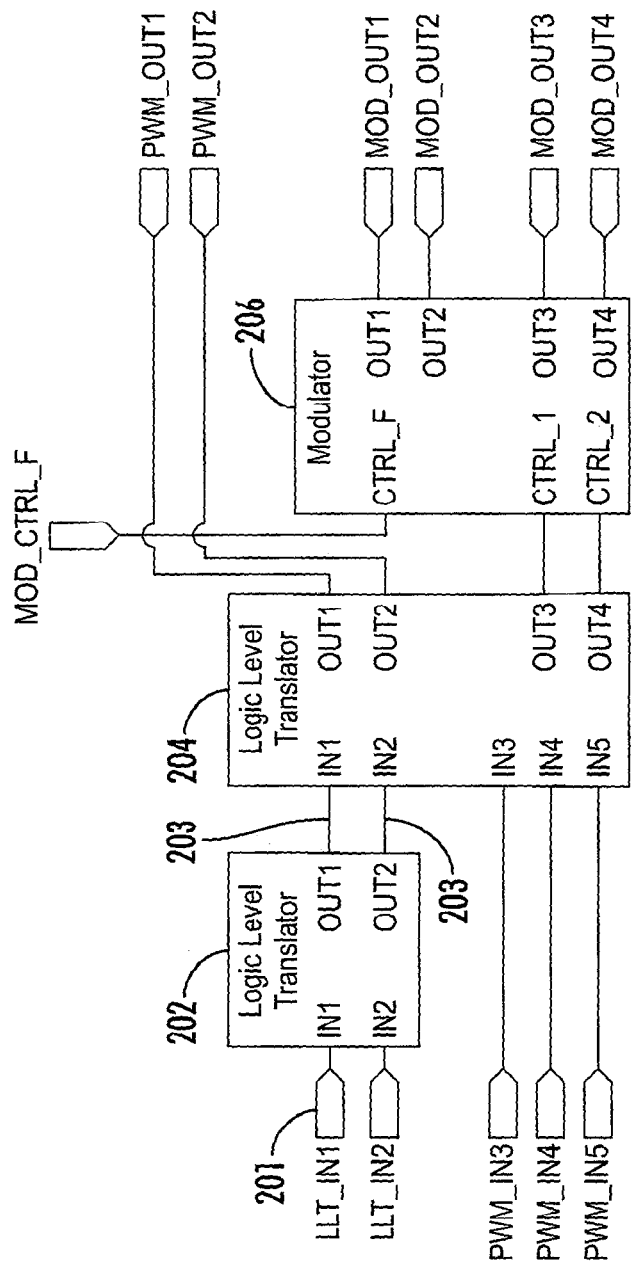
FIG. 2 is a block diagram of the Primary side of the HTSOI ASIC.

FIG. 2 shows the components of the gate driver's primary side block 102. The logic level translator 202 will accept either 3.3 V or 5 V logic signals 201. 3.3 V logic is level shifted up to 5 V logic for distribution further into the gate driver. Additionally, this logic level translator 202 has a Schmitt trigger input which will increase noise immunity at the gate driver's input. The pulse width modulation conditioner 204 (PWM) circuit provides logic functions for handling fault conditions and provides non-overlap protection for the two PWM inputs. The primary side modulator 206 amplitude modulates the PWM signals with a high frequency carrier which will be transmitted through an isolation transformer to the secondary side block 106 of the gate driver 100.

Figure 3:
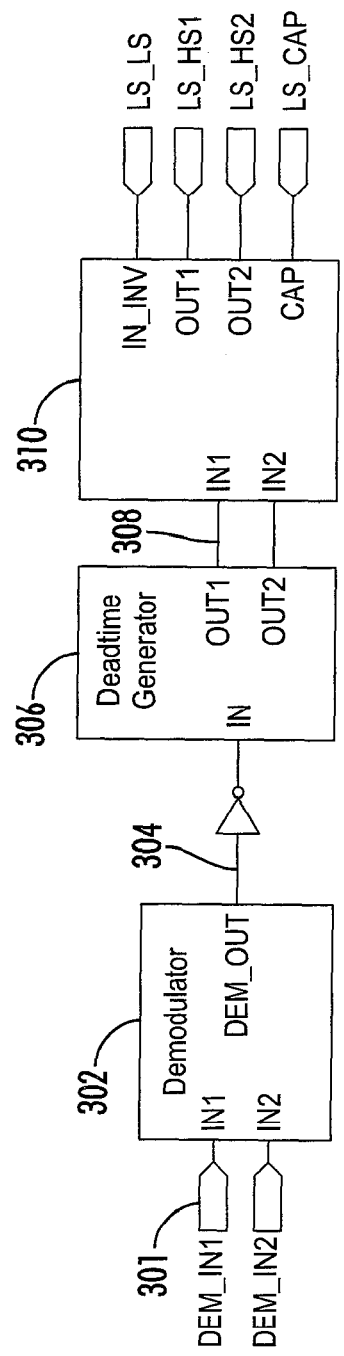
FIG. 3 is a block diagram of the Secondary side of the HTSOI ASIC.

FIG. 3 shows the components of the secondary side block 106 of the gate driver 100. The demodulator 302 converts the isolated modulated signal 301 from the isolation transformer 104 back into a copy of the original PWM shown as a secondary side logic signal 304. The deadtime generator 306 creates an output and complement signal set 308 from the PWM signal with a small amount of time where both signals are logic 0. These two output complement signals in the signal set 308 control the two transistors in the output totem pole block 108; thus, the signals 308 must have some deadtime to prevent both transistor turning on at the same time (causing shoot-through). The level shifter 310 is a floating buffer between the deadtime generator 306 and the output totem pole 108.

The following sections detail the components of the primary side block 102 and secondary side block 106 of the gate driver 100, as well as the protection circuitry and PWM controller integrated therein. All of these circuits have been tested to at least 225 degrees Celcius.

Logic Level Translator (LLT) 202

The Logic Level Translator 202 (LLT) is a voltage step up/down circuit 400. It will receive a pulse input signal 402 with a peak-to-peak value of 3.3V or 5V and convert it to an inverting output signal 414 with a peak-to-peak of 5V or 3.3V respectively. The inputs 402 to the LLT 202 are signals coming from long distances and noisy environments. Therefore, a simple hysteresis circuit 404 (Schmitt trigger) was added to the input 402 of the LLT 202. Since this hysteresis circuit 404 is very small and sensitive to its hysteresis transistor 409 sizes, a buffer 406 was needed between the hysteresis circuit 404 and the actual translator circuit 418.

Figure 4:
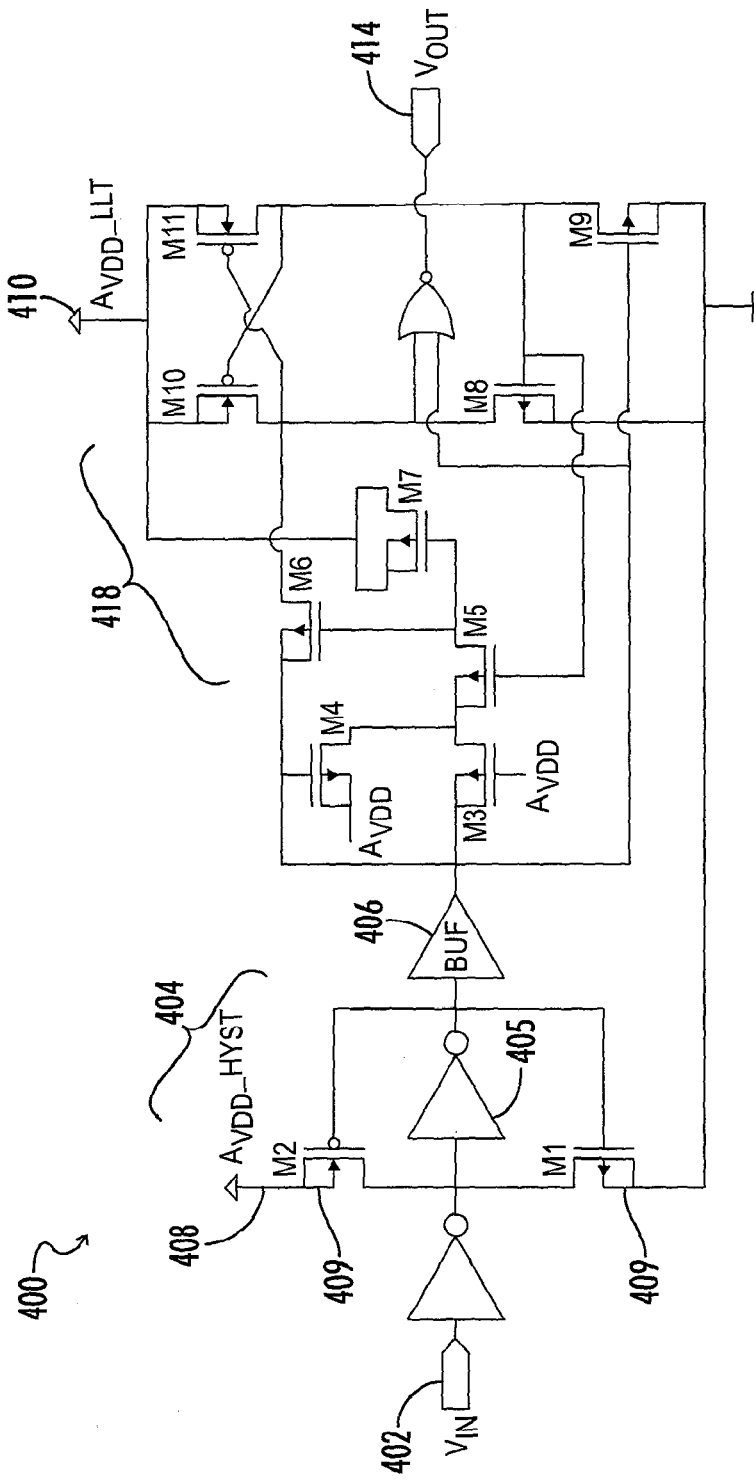
FIG. 4 is a Schematic of the logic level translator with hysteresis.

It is important to notice from FIG. 4, that the hysteresis and buffer power supply 408 for the buffer 406 is the same as the one for the hysteresis circuit 404 shown as AVDD_HYST 408 (peak-to-peak of the input signal should not be changed). This power supply 408 should be the same as the peak-to-peak value of the input signal 402. However, the translator power supply 410 for the translator circuit 418 is different depending on the function of the translator circuit 418 (step-up or step-down).

The buffer 406 after the hysteresis circuit 404 consists of 4 inverters in series with proportional increasing sizes in their width and length ratios. The hysteresis circuit 404 is a simple Schmitt trigger where the hysteresis depends almost exclusively on the threshold level of the input inverter 403. The two transistors 409 in the circuit are feedback transistors which help to pull the midpoint of the circuit high or low depending on the threshold level of the second inverter 405. Since this circuit has to operate with either 3.3 Vp-p or 5 Vp-p inputs, then a considerable tradeoff had to take place in order to satisfy both inputs and still provide some hysteresis.

The input high level voltage (VIH) and the input low level voltage (VIL) were the values used to determine the hysteresis band. In the case of 5 Vp-p signal, these values are approximately 3.5 V and 1.5 V respectively, and in the case of 3 Vp-p signals, these values are approximately 0.7 Vcc (2.31 V) and 0.2 Vcc (0.66 V) respectively. The HTSOI IC gate driver 100 makes use of two voltage step up/down circuit 400 on its primary side. The step output signals 203 of the voltage step up/down circuits 400 are used as control signals for the PWM conditioner 204.

Pulse Width Modulation Conditioner 204

Figure 5:
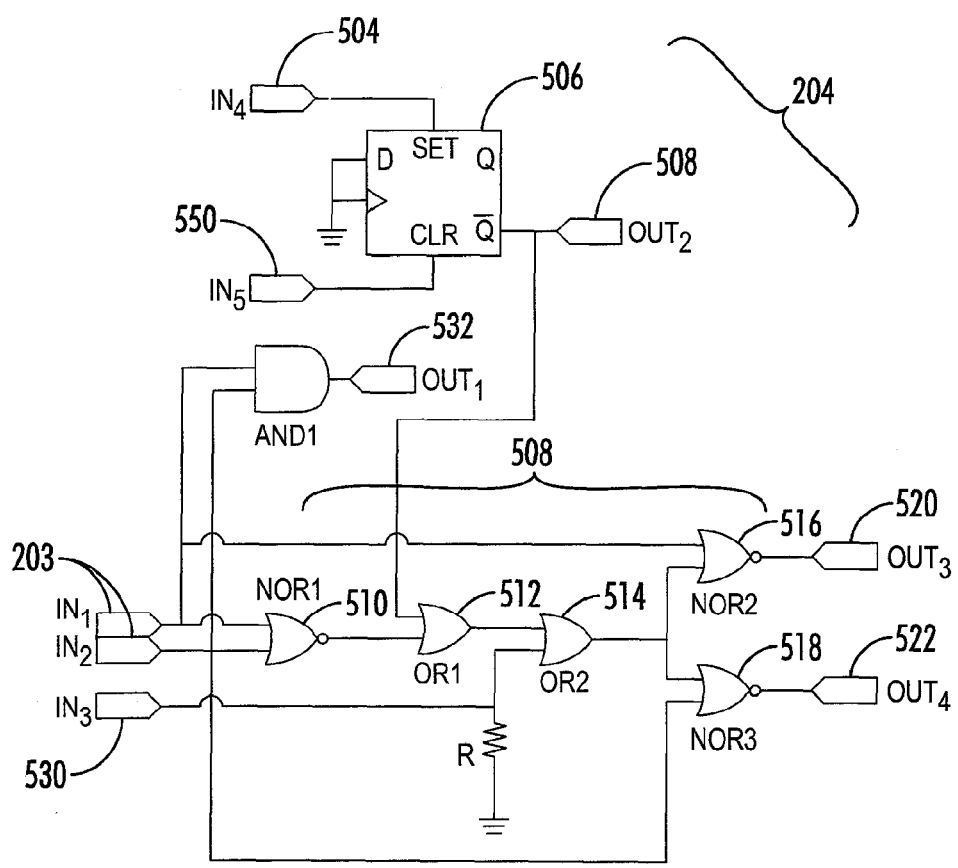
FIG. 5 is a Schematic of the PWM conditioner.
Figure 6:
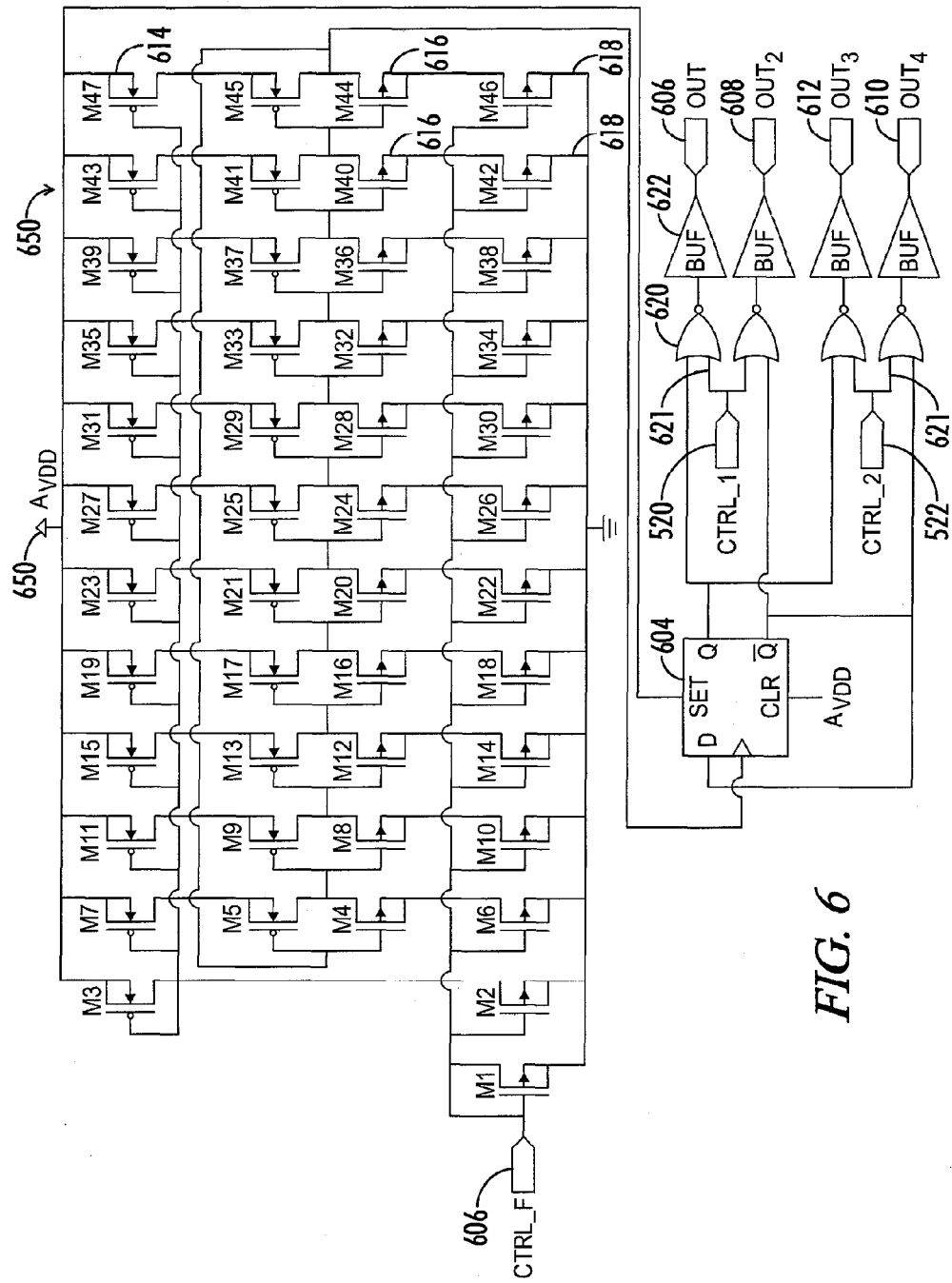
FIG. 6 is a Schematic of the modulator.

FIG. 5 shows the schematic of the pulse width modulation conditioner circuit 204. The purpose of the PWM conditioner 204 is to provide non-overlap protection and basic fault handling capabilities to the downstream higher level gate driver circuitry. Each step output signal 203 is connected to a pulse width buffer 502 consisting of a chain of four ratio sized inverters (nor gate 510, or gate 512, or gate 514, and nor gate 516 or nor gate 518) to provide enough power to drive a 30 pF load at conditioned output three 520 and conditioned output four 522.

When a fault is detected in the system, a fault signal 504 will be sent to the conditioner latch 506 (D-FF) which will latch into the fault state. Conditioned output two 508 will become high, which will be carried through or gate 512 and or gate 514. This will cause conditioned output three 520 and conditioned output four 522 to be logic low no matter what the inverted PWM input is on step output signal 203. Input three clear signal 530 is used to momentarily (non-latching) disable the PWM outputs 520, 522. When the fault clears, a clear signal 550 will be sent to the D-FF 506 which will latch out of the fault state. This signal 550 can come from an external controller or conditioned output one 532 can be used. If conditioned output one 532 is used, the fault state will be disabled when both inverted step output signal 203 are high. Nor gate 510 disables the PWM outputs 520, 522 if both inverted step output signals 203 are low which provides non-overlap protection.

Modulator 206

The modulator 206 can modulate the PWM outputs 520, 522 onto a high frequency carrier with either amplitude modulation (AM) or frequency modulation (FM). The oscillator for the modulator is a voltage controlled oscillator 600 (VCO); therefore, FM can be achieved by redirecting the PWM control signal onto the VCO's input. The modulator is also capable of gating its output on and off, thus providing on-off keying (OOK) capability, a form of AM.

The modulator's VCO 600 uses a single-ended ring of current-starved inverters 616 and a modulator latch 604 in order to produce a primary modulated output 605 via differential outputs 606, 608, 610, 612. The use of the modulator latch 604 allows the duty cycle of the VCO 600 to remain fairly stable regardless of the frequency changes. The current-starved inverters 602 used in the VCO allow controlling the oscillating frequency using an external voltage input 606. Using an additional current source transistor 614 and sink transistor 618 in series with the PMOS and NMOS of the inverter 616 respectively, the current that flows through the inverter 616 can be limited by controlling the gate voltage of the current source transistors 614 and sink transistors 618.

The two outputs of the modulator latch 604 are each connected to one input of two modulator NOR gates 620. The remaining nor gate inputs 621 of the NOR gates 620 are controlled by conditioned output three 520 and conditioned output four 522 generated by the PWM conditioner 204. This circuitry is what enables the OOK feature. If FM is preferred, simply connect the remaining nor gate inputs 621 to logic 0. Note that, using this topology, two PWM channels can be modulated using OOK or just one channel if FM is used. The outputs of the NOR gates 620 are buffered with modulator buffers 622 in order to increase the output current capability.

Implementation of FM requires detailed knowledge about the modulator's performance in order to design a demodulator which will correctly decode the modulated signal. This data is just becoming available, so the FM demodulator has not yet been designed. However, it will likely be implemented with traditional techniques using the same VCO circuit as the modulator. OOK, however, requires very simple circuitry for demodulation which was fabricated in the prototype. Therefore, most of the following test results utilized OOK as the modulation scheme.

Figure 7:
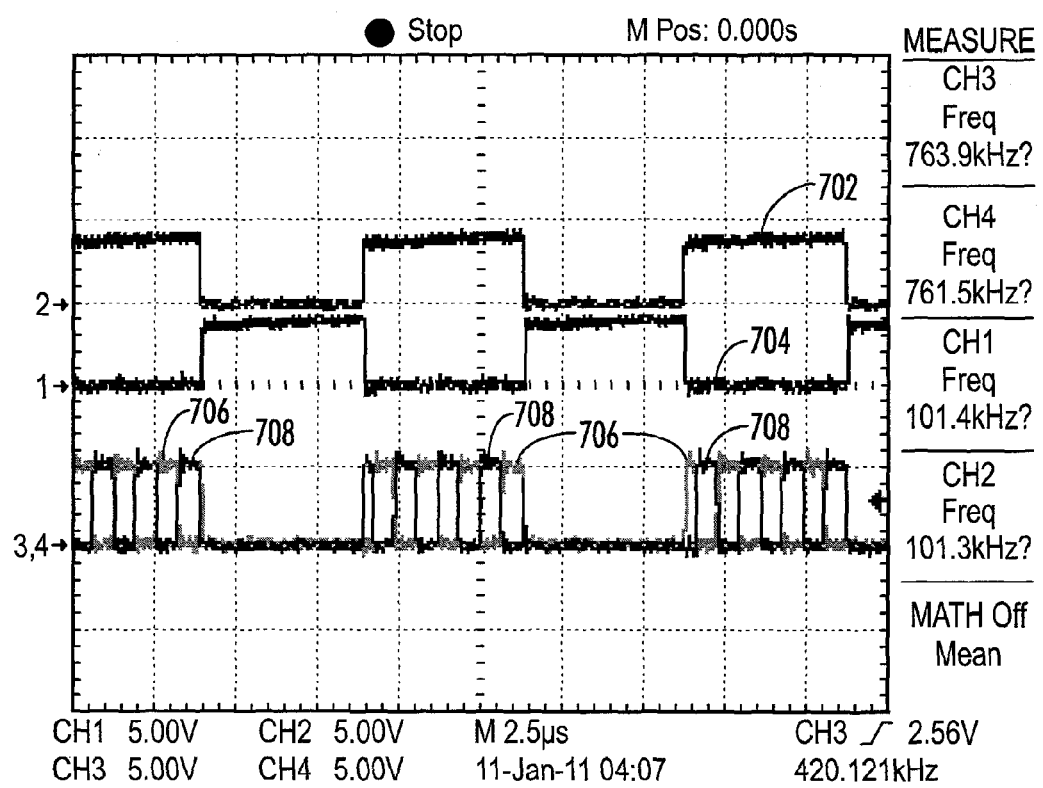
FIG. 7 is a chart of the Gate driver primary waveforms including Channel 1 input (top), Channel 2 input (high middle), and Channel 2 output 1 and Channel 2 output 2 (bottom).

FIG. 7 shows the input waveforms 702, 704 form the conditioned output three 520 and conditioned output four 522 and output waveforms 706, 708 for the OOK modulator 600. The output 606, 608, 610, 612 of the modulator 600 switches at the carrier frequency during a low PWM signal and is zero during a high PWM signal. The carrier frequency can be adjusted by the input voltage 606 to the VCO 600.

Figure 8:
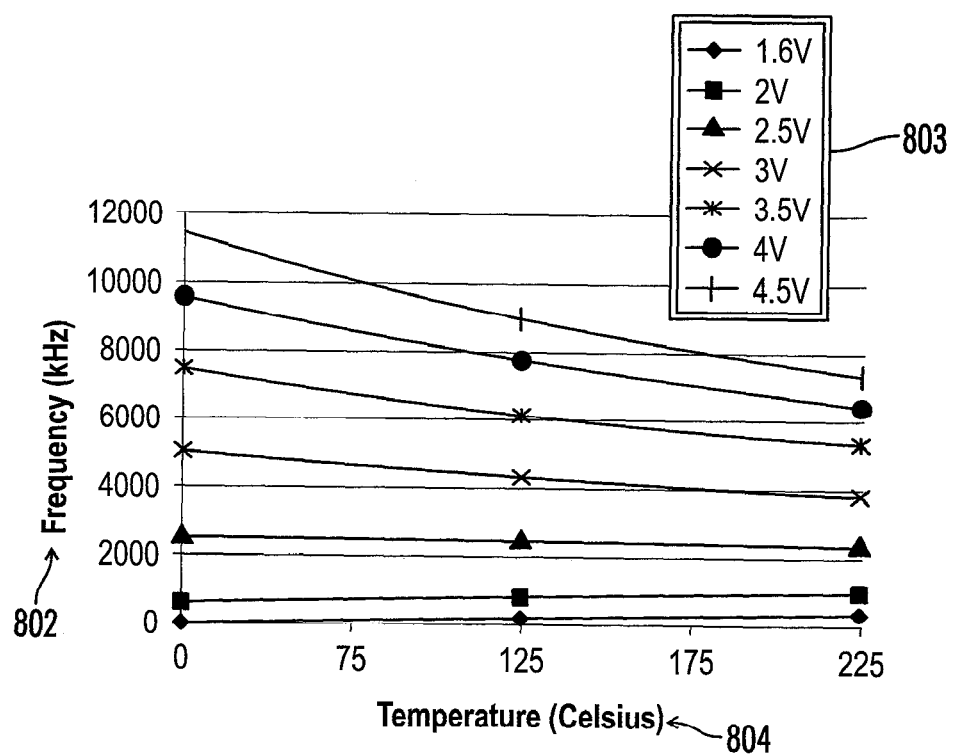
FIG. 8 is a chart of VCO output frequency vs. input voltage and temperature.

FIG. 8 shows the variation in carrier frequency 802 due to input voltage 803 and temperature 804. When the VCO input 803 is set to 2.5 V the carrier frequency 802 remains at a fairly constant 2.5 MHz with respect to temperature 804. Higher carrier frequency 802 will allow greater noise immunity, higher PWM frequency, and faster propagation delay. As the carrier frequency 802 increases, the modulator output becomes more triangular, which could create errors in data transmission. Practically, the 2-5 MHz range is the most useful range for the ASIC gate driver 100.

Demodulator 302

Figure 9:
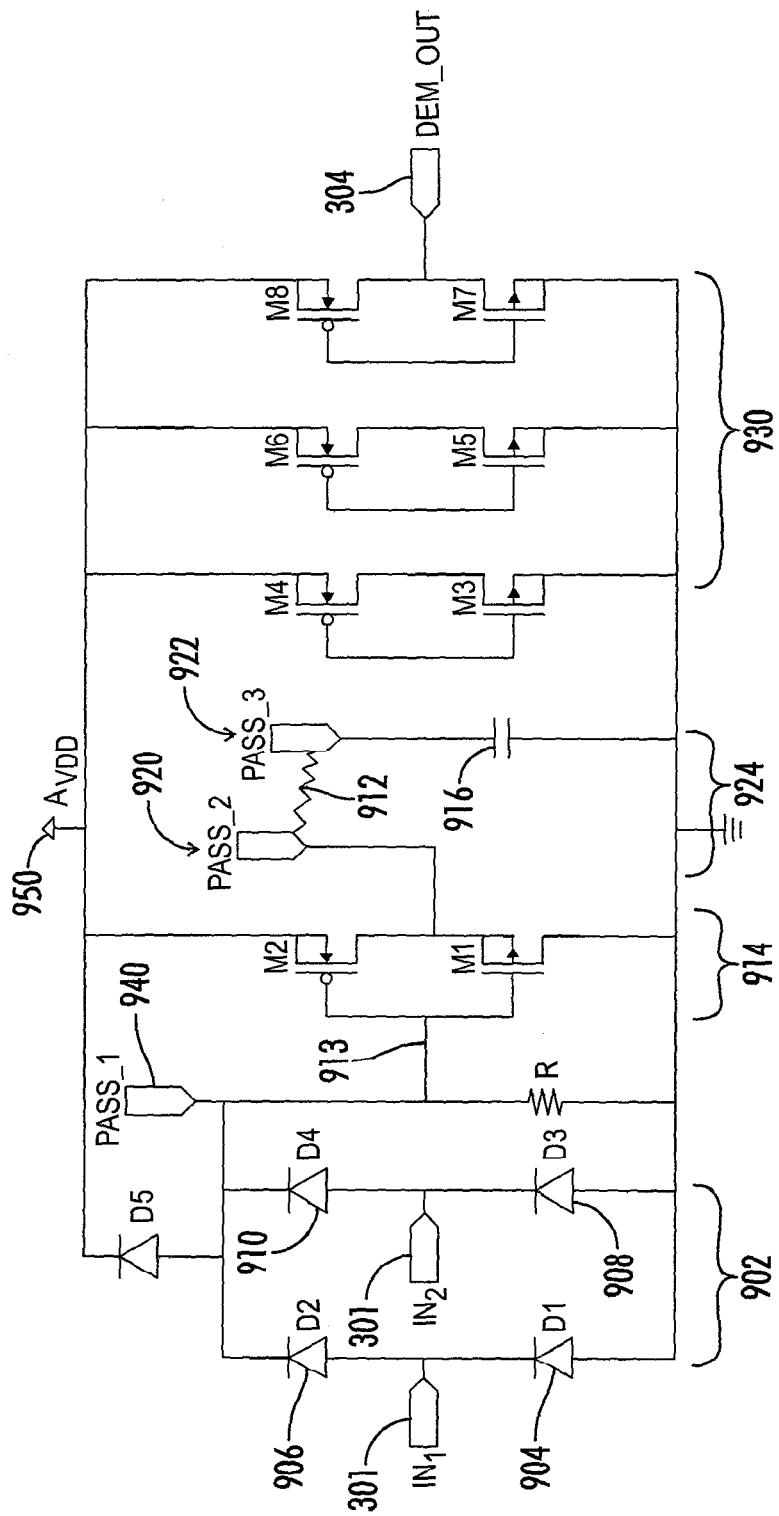
FIG. 9 is a Schematic of the demodulator.

The demodulator 302 decodes the differential oscillating isolated modulated signals 301 received from the transformer 104 into a drive signal 107 coordinated with the original PWM signal. As discussed in the previous section, this version of the ASIC gate driver 100 includes an OOK demodulator 302. The demodulator circuit 900 includes a demodulator input stage 902 that consists of four diodes 904, 906, 908, 910 connected in a full-wave rectifier configuration, as shown in FIG. 9. The isolated modulated output 301 of the signal isolation transformer 104 connects to the demodulator input stage 902, which is rectified into external high pass filter connection 940. External filter connection passage 940 connects externally to a parallel RC circuit which filters out the high frequency carrier, but not necessarily dv/dt noise. Increasing the capacitance value can increase noise immunity, but it will add uneven propagation delay to the gate driver. When a signal is present on the output 301 shown as IN1 and IN2, the capacitor will charge. When the signal stops, the parallel resistance 912 will discharge the capacitor.

The rectifier is followed by an inverter 914 to buffer the demodulated signal 913. First external resistor connection 920 and second external resistor connection 922 connect externally through a resistor 912, which will form a low-pass filter 924 (RC filter) with the internal capacitor 916 connected to passout 922. This RC filter 924 will reduce the dv/dt induced noise influence on the demodulator while adding symmetrical propagation delay. The filter 924 is followed by a buffer 930 composed of 3 size-scaled inverters to form the secondary side logic signal 304, which then connects to the dead-time generator 306.

Dead Time Generator 306

Figure 10:
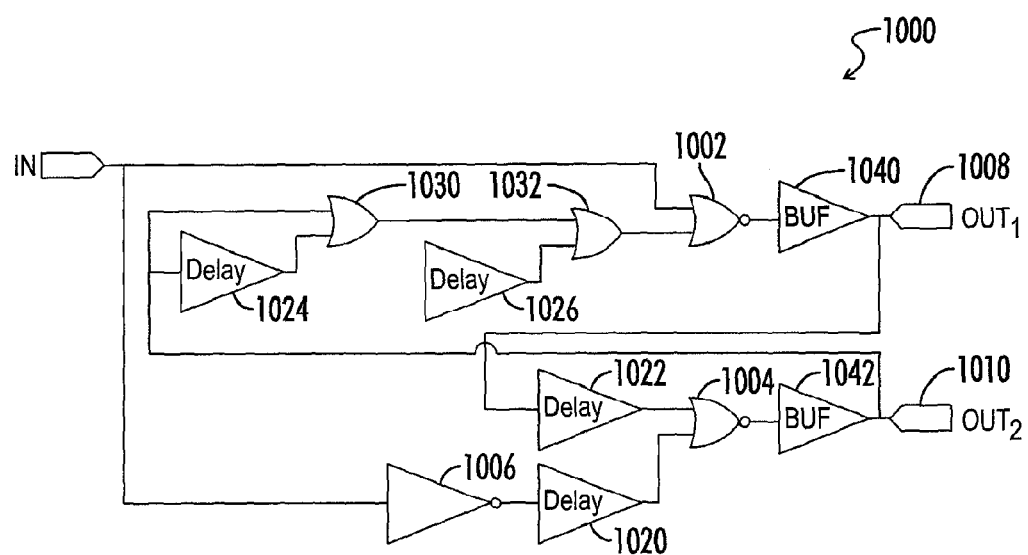
FIG. 10 is a Schematic of the deadtime generator.
Figure 11:
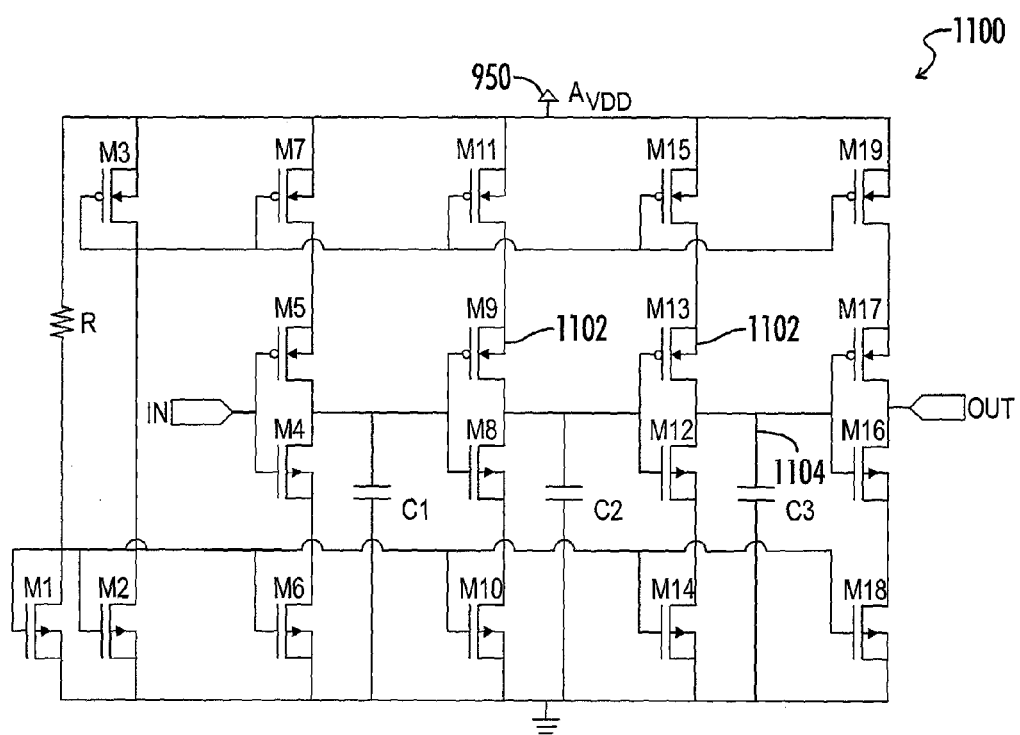
FIG. 11 is a Schematic of the deadtime generator delay cell.

The dead-time generator 306 (DTG) will receive the demodulated PWM signal and provide two non-overlapping output signals 308, one the complement of the other. One output signal will follow the input (with some delay) while the other will be the opposite of the first one with some time where both signals are logic 0. FIG. 10 and FIG. 11 show the schematic circuit 1000 of the dead time generator 306 and the transistor level schematic circuit 1100 of one of its delay cells respectively.

The DTG circuit 1000 makes use of the basic principle of using two NOR gates 1002, 1004 and an inverter 1006 to produce two non-overlapping signals 1008, 1010. However, due to the requirements of at least 90 ns of dead-time, chains of delay circuitry 1020, 1022, 1024, 1026 in conjunction with NOR/OR gates (nor) 1002, 1004, (or) 1030, 1032 were used before outputting the output signal 1008, 1010. The DTG circuit 1000 has the capacity to handle a 2 pF load (the input capacitance of the level-shifter that is controlled by the DTG output signals is 1.5 pF). This was achieved by inserting a deadtime buffer 1040, 1042 at the two output signals 1008, 1010 which form the output and complement signal set 308.

Note that there are three different kinds of delay circuitry 1020, 1022, 1024, 1026 depending on how much delay was needed at that stage of the circuit. As shown in FIG. 11, the delay circuitry 1100 consist of chains of current-starved inverters 1102 with internal capacitors 1104 between the chains (the capacitor 1104 sizes are the only difference between these delay circuits 1020, 1022, 1024, 1026).

Level Shifter 310

The output stage of the prototype gate driver is composed of two discrete Silicon Carbide (SiC) junction gate field-effect transistors (JFETs) connected in a totem-pole configuration 108. The output totem pole transistors 110, 112 will be located on the ASIC in future revisions. The level shifter 310 allows the digital signal from the deadtime generator 306 to float with the source 308 of the high side totem pole transistor 110. The buffer for the low side totem pole transistor 112 is also included in this block, though it does not provide a level shifting function.

Figure 12:
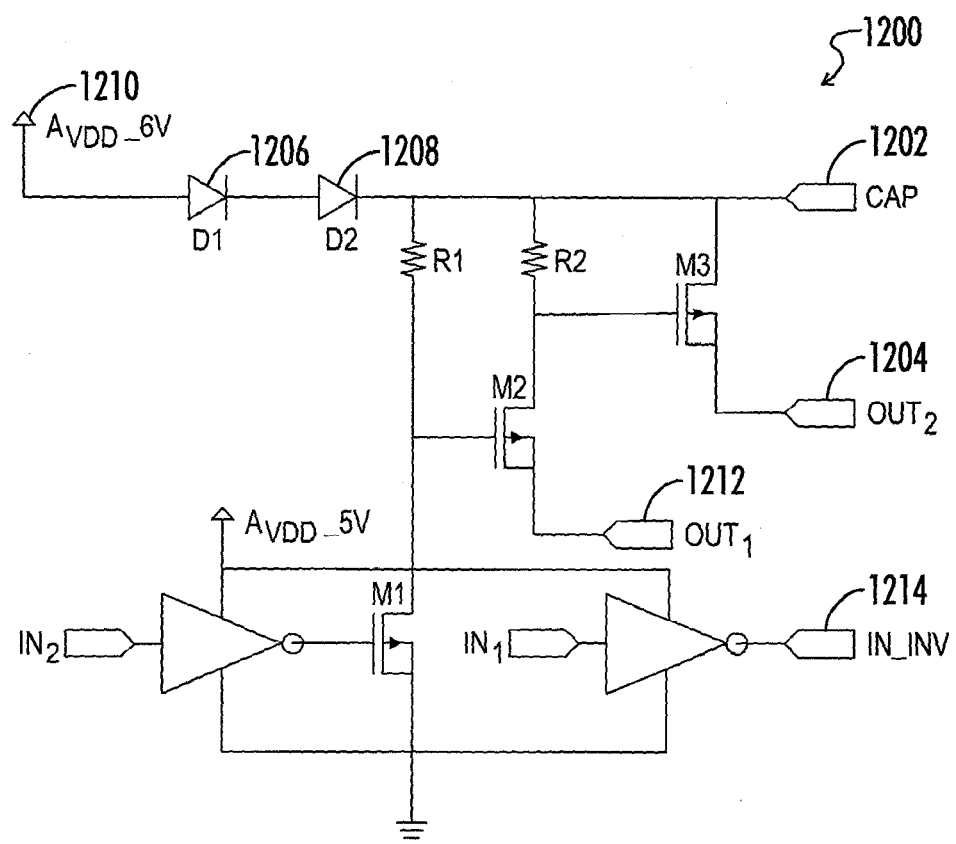
FIG. 12 is the Levelshifter schematic.

FIG. 12 shows the schematic of the level shifter circuit 1200. The gate of the high side totem pole transistor 110 requires higher voltage (respect to the source) than the power rail voltage supply to turn the device on. This levelshifter circuit 1200 utilizes a bootstrap capacitor to provide power the levelshifter when it is floating with the source of the high side transistor 110. The bootstrap capacitor is connected externally from pad capout 1202 to capout 1204. When the low side transistor 112 of the output totem pole turns on, the bootstrap capacitor charges through diodes 1206 and 1208 from the 6V supply 1210. Due to the voltage stored across the capacitor, the bootstrap voltage rises 5 volts above the power rail voltage of the power stage providing sufficient gate voltage to turn on the high side transistor 110.

PWM Generator

The PWM generator is intended to be used for the gate driver's isolated power supply 950 (not as PWM inputs to the gate driver), which will power the secondary sides of the gate driver 100. Thus, it is considered part of the gate driver 100 and is included on the same IC. While this circuit could be used to provide the PWM inputs to the gate driver 100 in some applications, it does not include advanced features needed for most high power systems.

Figure 13:
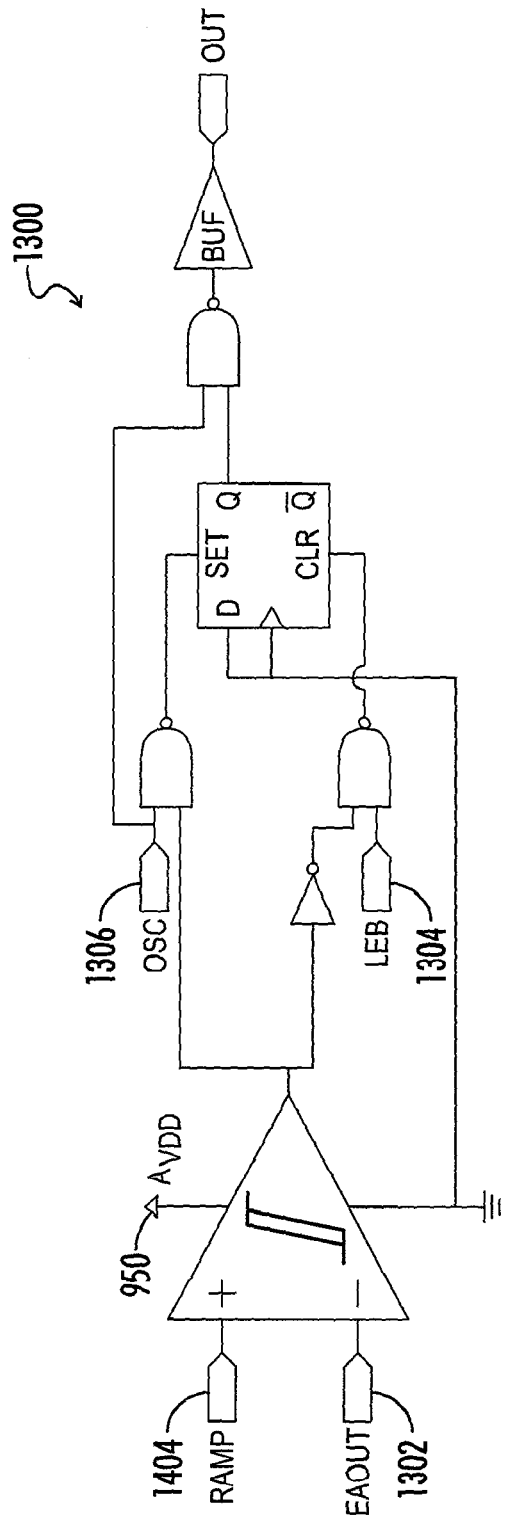
FIG. 13 is a Schematic of the PWM generator's PWM logic.
Figure 14:
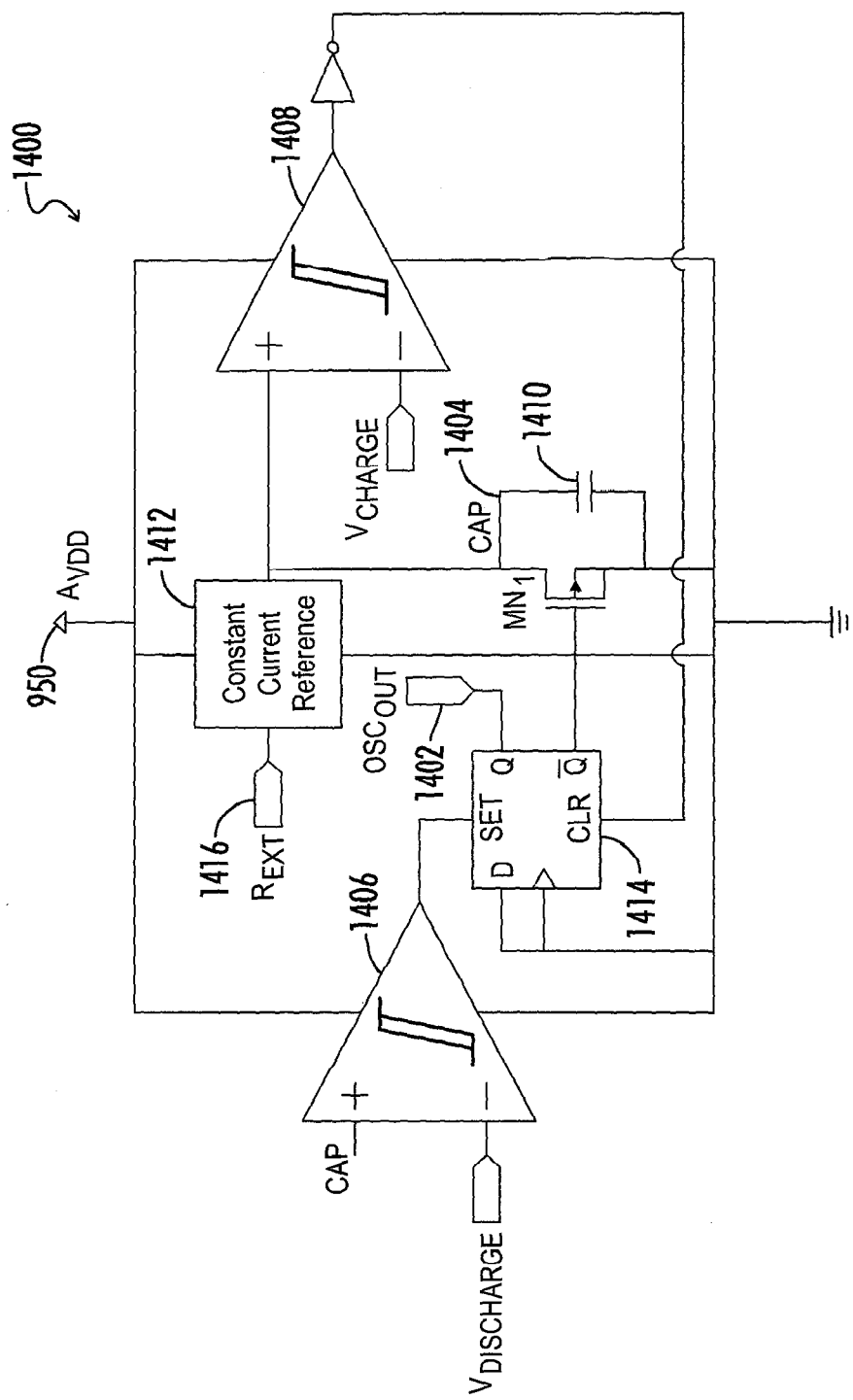
FIG. 14 is a Schematic of the PWM generator's oscillator.

The PWM generator consists of two circuits: PWM logic 1300 and an oscillator 1400, as shown in FIG. 13 and FIG. 14, respectively. The oscillator 1400 generates a high duty cycle square wave signal 1402 and a ramp signal 1404 at the same frequency. The duty cycle of the square wave 1402 sets the maximum duty cycle of the PWM generator's output. As shown in FIG. 13, the ramp signal 1404 is then compared to the output of the error amplifier 1302, EAOUT, which produces a pulse width modulated signal. The generator also contains logic to support leading-edge blanking 1304, a method of noise reduction.

As shown in FIG. 14, the oscillator 1400 was implemented using two comparators 1406, 1408 monitoring the charging and discharging of a capacitor 1410 through a constant current source 1412. The signals generated by the comparators were used to set and reset a oscillator flip flop D-FF 1414. The constant current source 1412 was implemented using a current-steering circuit to achieve larger current using different stages. An external resistor 1416 is used to set the current level.

As shown in FIG. 13, the RAMP signal 1404 in the PWM logic connects to the CAP output 1404 from the oscillator circuit 1400. While not shown in these schematics, the OSCOUT signal 1402 from the oscillator 1400 should pass through an inverter and then connect to the OSC node 1306 in the PWM logic circuitry.

High-Speed Comparator

Figure 15:
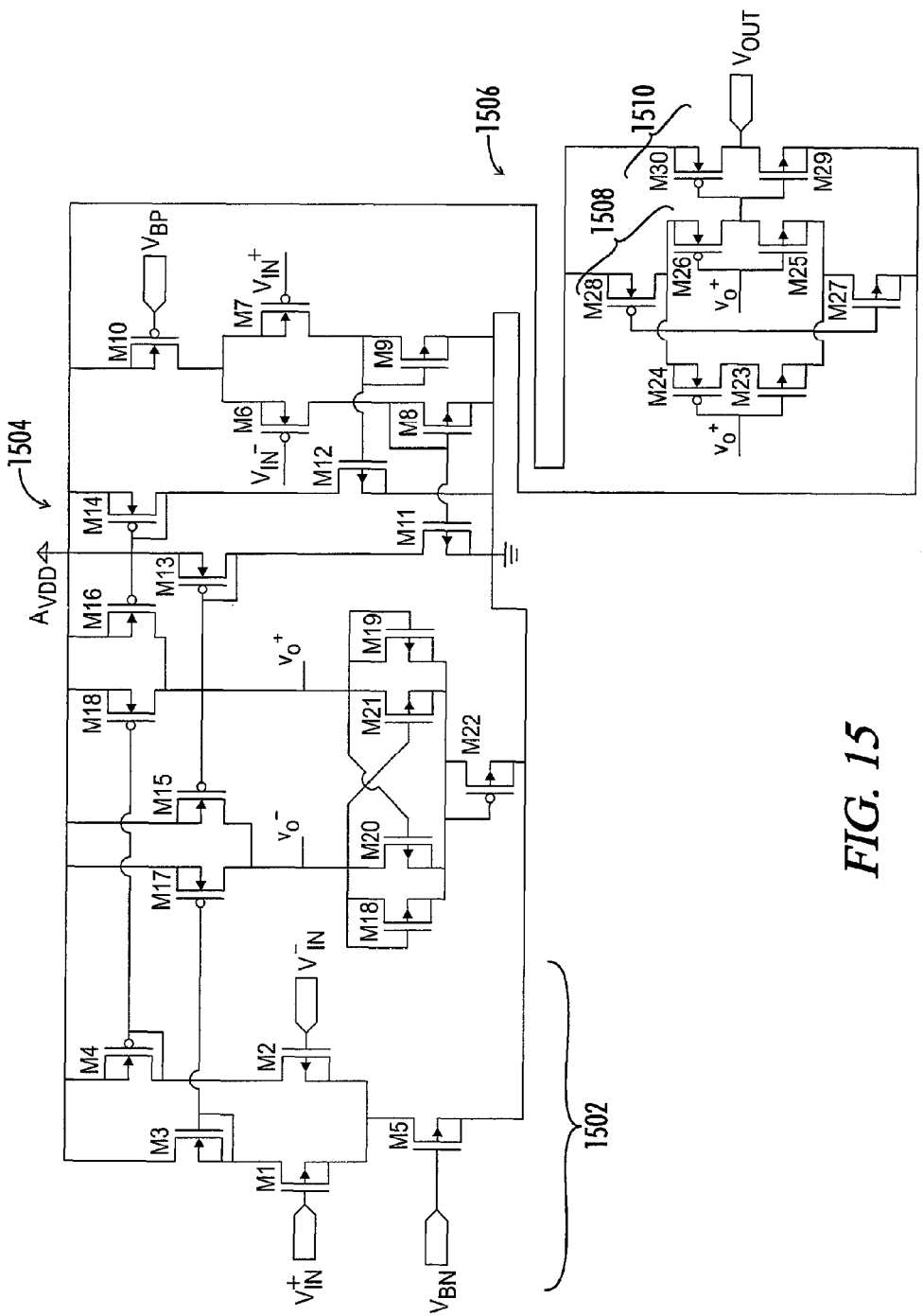
FIG. 15 is the High speed comparator schematic.

The high-speed comparator is for general purpose use in the implementation of protection circuitry, PWM generation and other functionalities in the IC gate driver 100. High-speed operation is desired since protection circuits must be able to respond to faults as quickly as possible. Easily configured hysteresis is also desirable to meet the needs of the various circuits that use the comparator. FIG. 15 shows the high-speed comparator schematic circuit 1500.

The design consists of three stages: preamplifier 1502, latch 1504 and postamplifier 1506. The preamplifier 1502 and latch 1504 transient response times complement one another, resulting in high-speed, bistable functionality. The preamplifier 1502 is composed of both a PMOS and NMOS differential input stage in order to maximize the input common mode range. The latch design 1504 is such that the ratio of the cross-coupled devices to the diode connected devices is non-linearly proportional to the amount of hysteresis. The latch output has a bistable nature, transforming the analog differential input into a pseudo-digital signal. The postamplifier 15060 is composed of a self-biased differential amplifier 1508 followed by an output buffer inverter 1510. This transforms the input from the bistable latch into a rail-to-rail output. The output buffer inverter 1510 provides the comparator with more drive strength.

The high-speed comparator has a hard-switching propagation delay less 20 ns driving an on-chip 0.5 pF load. With 60 mV of overdrive the propagation delay is less than 40 ns. Rise and fall times are no greater than 7.5 ns. The input common mode range is from 1.0 to 3.5 V. Hysteresis levels have been implemented from no hysteresis to VREF±65 mV.

Overcurrent Protection

Figure 16:
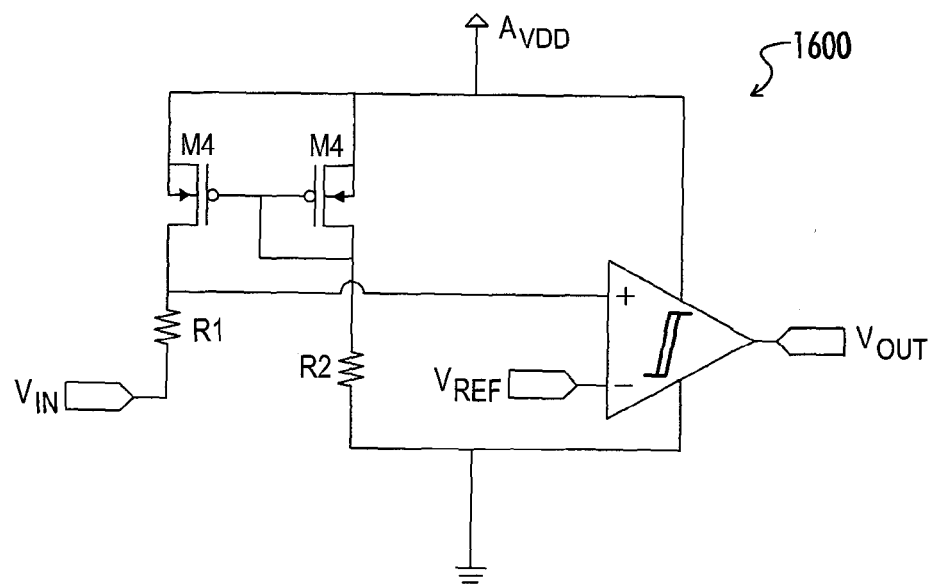
FIG. 16 is the Over current protection schematic.
Figure 17:
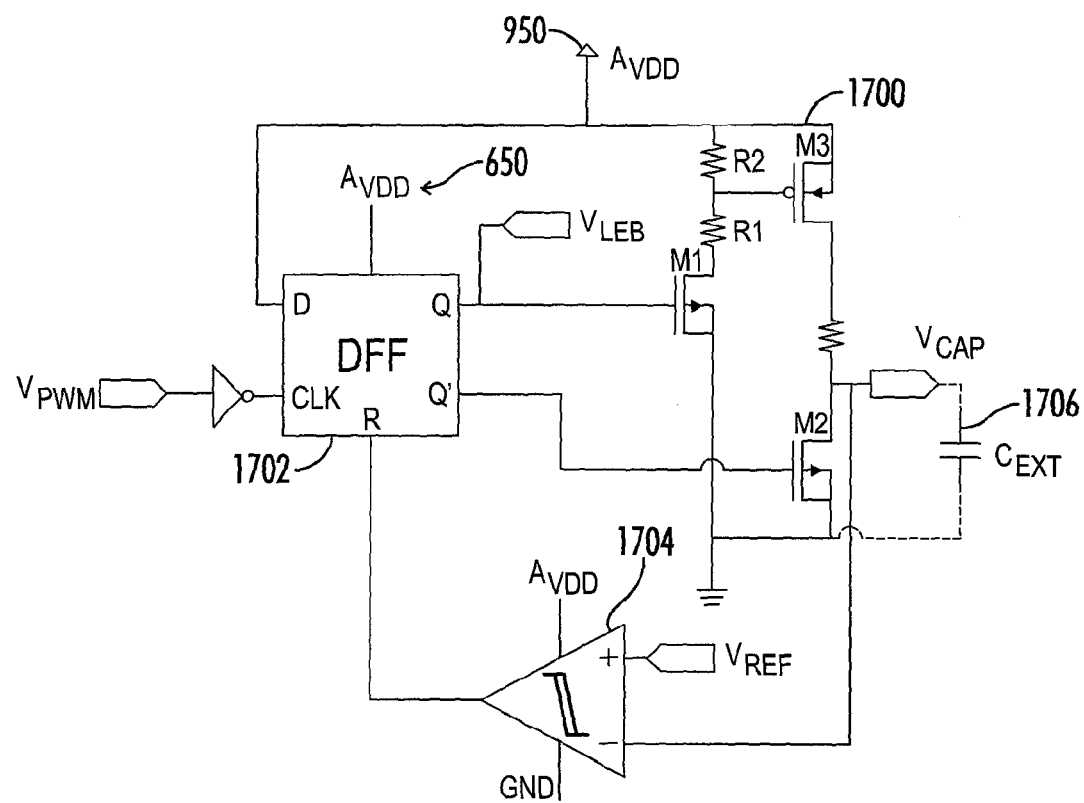
FIG. 17 is the Leading-edge blanking schematic.

The overcurrent protection (OCP) circuit 1600 monitors the current through the power devices and will disable the PWM signal (turn the power device off) if a fault is detected. The current is monitored using a small sensing resistor, RSENSE, placed in series with the power stage between the low side device and ground. RSENSE is sized so that the voltage drop across it is 0.5 V when the maximum allowable current occurs. The OCP also includes a leading-edge blanking (LEB) sub-circuit which disables and invalid OCP output when high currents are expected during switching transients. With the gate driver's PWM signal as its input the LEB is able to anticipate when high currents are expected. FIG. 16 and FIG. 17 show schematics of the OCP and LEB, respectively.

The OCP is composed of the previously described high-speed comparator 1500 preceded by a voltage translator circuit 1600. The voltage translator 1600 was designed to boost the input voltage from 0.5 V up to 2.5 V where the comparator operates optimally. The OCP propagation delay is no greater than 60 ns, giving very fast fault sensing capability.

The LEB circuit 1700 is based on the setting and resetting of a D flip-flop 1702. It is composed of a D flip-flop 1702, high-speed comparator 1704, and active and passive devices. The blanking time is programmable by an external capacitor 1706, CLEB. The PWM input signal sets the flip-flop, thus beginning the blanking time and charging CLEB. The comparator monitors the CLEB's voltage against a set reference, resetting the flip-flop once the reference is exceeded. This ends the blanking time and CLEB is discharged. The LEB is capable of producing blanking times from 75 ns to 3.25 μs.

Undervoltage Lockout

Figure 18:
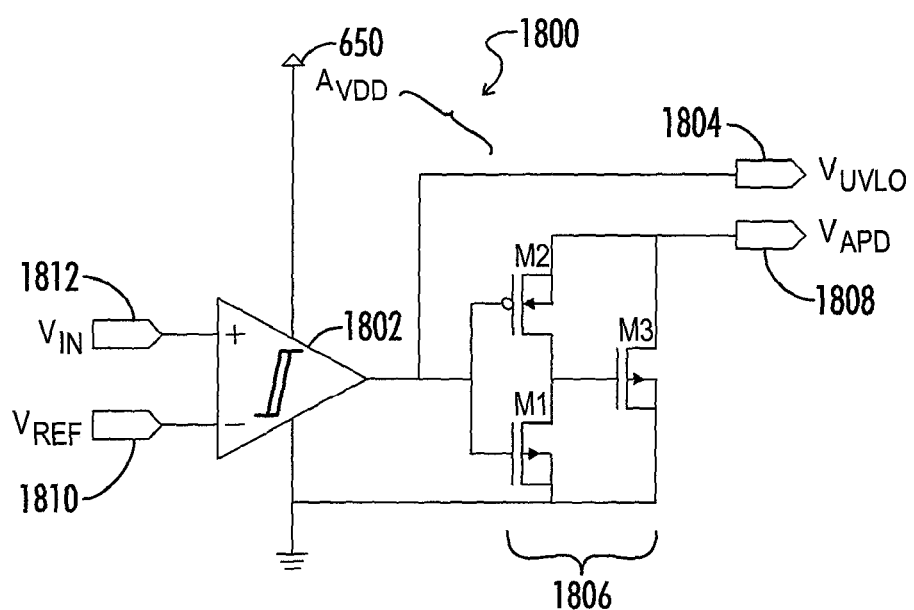
FIG. 18 is the Undervoltage lockout and active pull down schematic.

The undervoltage lockout (UVLO) circuit 1800 shown in FIG. 18 monitors the gate driver power supply 650 to check that sufficient voltage levels are present for proper circuit operation. This is especially important in startup conditions. This protection must include hysteresis to provide immunity to slowly changing or noisy input signal which can produce a noisy output if unaddressed. The UVLO circuit 1800 includes a sub-circuit driven by the UVLO output 1804 which functions to actively pull LOW a node 1808 connected to VDD through a 10 kΩ pull-up resistor. This circuit is referred to as the active pull-down (APD) circuit 1806.

The UVLO circuit is made up of the high-speed comparator 1802 with a hysteresis band of ±0.05 V. The VREF input 1810 is generated by bandgap reference circuit or a diode clamp and the VIN input 1812 is generated by a resistor divider connected to VDD 650. When calibrated properly, this arrangement causes the ULVO output 1804 to switch when VDD 650 exceeds or falls below the 4.5±0.05V threshold. The APD circuit 1806 is made up of a self-biased current sink enabled by the UVLO output 1804. Using this setup, the node 1808 to be pulled LOW does not exceed 1.9 V.

Totem-Pole Output Driver

Figure 19:
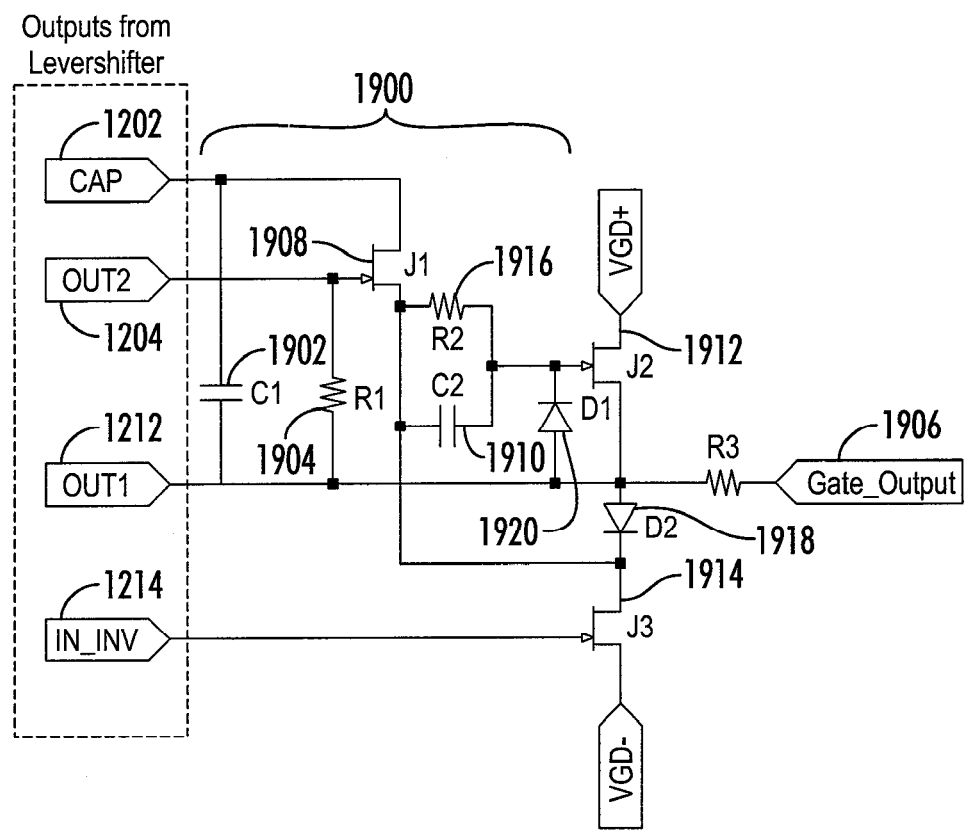
FIG. 19 is a Schematic of the output totem pole and high side buffer.

The original intent of the levelshifter 310 was to directly control the output stage of the gate driver which consists of two normally-off SiC power JFETs 110, 112 in a totem pole configuration. However, the levelshifter circuit 1200 did not have sufficient current capability to drive the high side transistor 110 at high speed; therefore, a discrete buffer circuit 1900 was added to the totem pole output 108 as shown in the discrete buffer circuit 1900 of FIG. 19. Again, this circuitry 1900 will be integrated onto the ASIC in future revisions. The four inputs 1202, 1204, 1212, 1214 in the box to the left indicate outputs from the ASIC's levelshifter. Buffer capacitor 1902 is the bootstrap capacitor detailed in the levelshifter section above. Buffer resistor 1904 provides a load to the source follower output 1204 of the levelshifter which is fed into the external source follower JFET 1908, a small signal normally-on SiC JFET. Follower capacitor 1910 capacitively couples the output of follower JFET 1908 to the gate of the high side output transistor 1912 and follower resistor 1916 provides the steady state current needed to keep follower JFET 1908 turned on after the initial transition. Middle diode 1918 pulls down the source of follower JFET 1908 when lower JFET 1914 is turned on, thus pulling down the gate of upper JFET 1912 and turning it off. Gate diode 1920 then becomes forward biased which resets the voltage across Follower capacitor 1910. This action is necessary to provide fast transitions on the gate of upper JFET 1912.

Complete Gate Driver 100

The ASIC gate driver 100 was constructed as several independent blocks in order to mitigate risk. These blocks were connected externally to build the complete gate driver, but will directly connect together on the final version of the ASIC.

Figure 20:
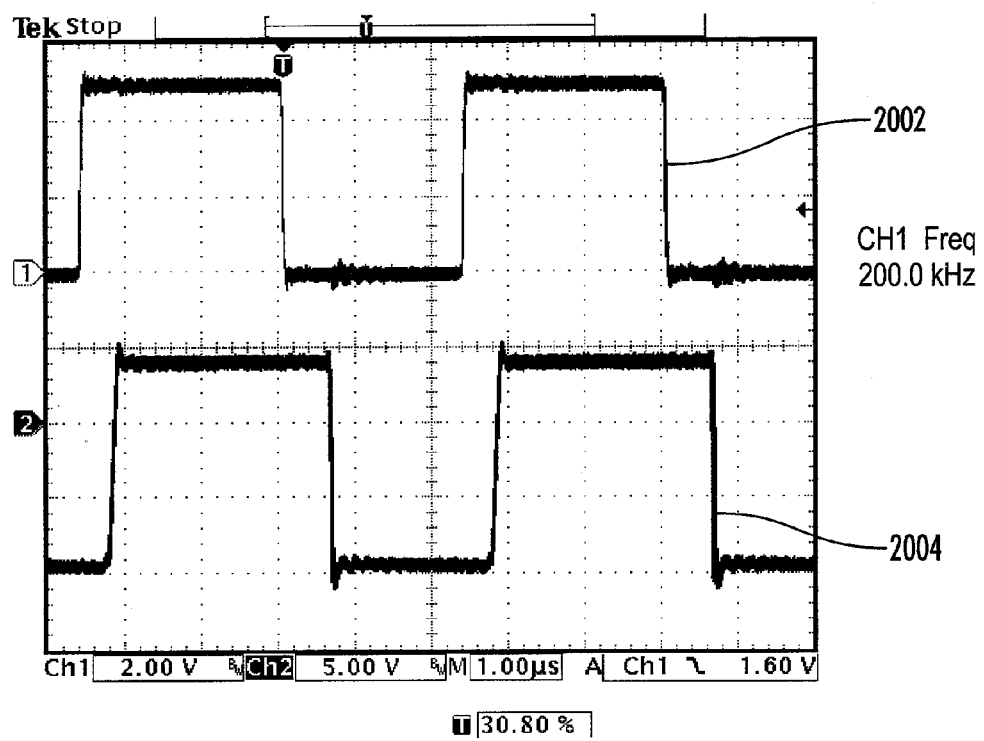
FIG. 20 is a graph of the Gate driver input (top) and output (bottom) @ 200 kHz.
Figure 21:
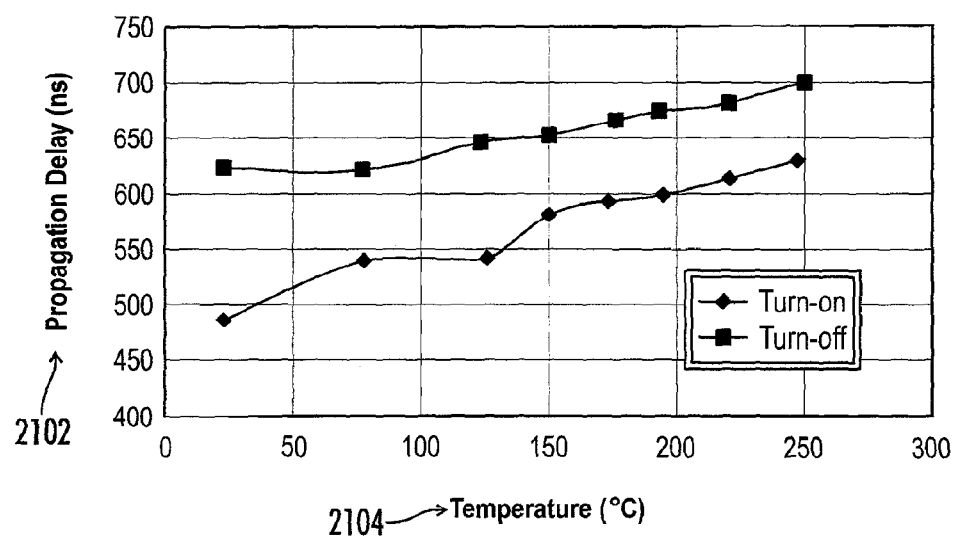
FIG. 21 is a chart of the Gate driver input to output propagation delay.
Figure 22:
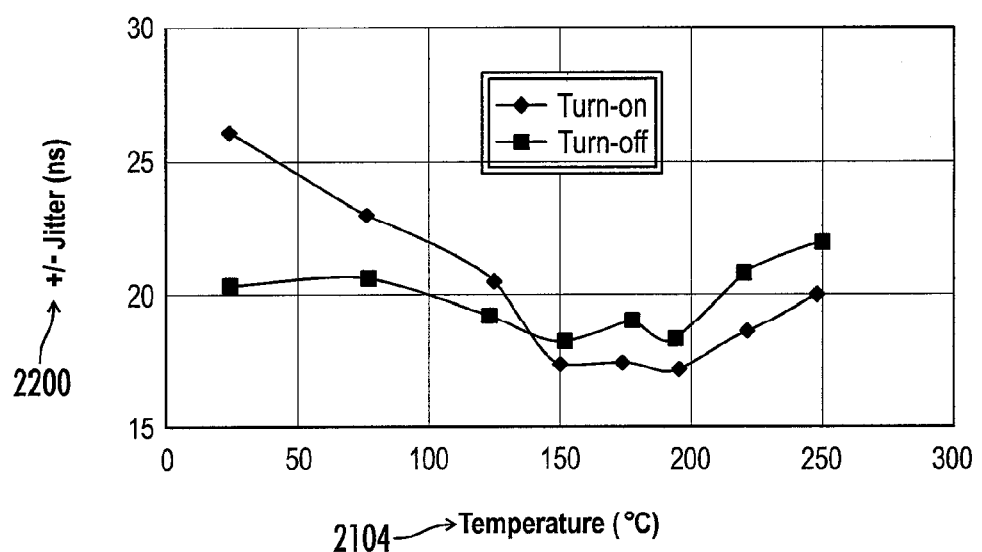
FIG. 22 is a chart of the Gate driver input to output jitter.
Figure 23:
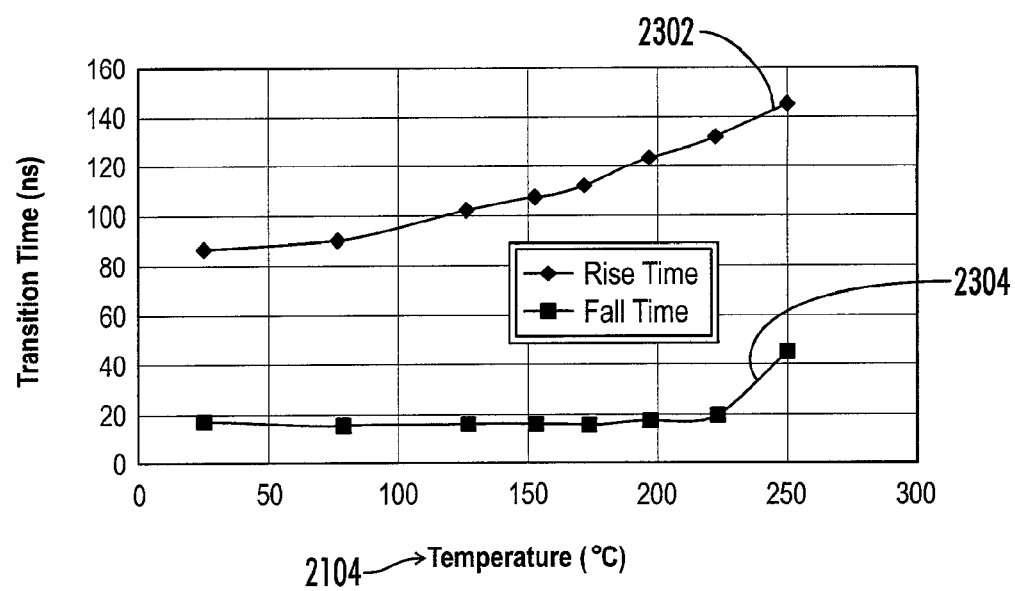
FIG. 23 is a chart of the Gate driver output rise and fall times.

FIG. 20 shows the input waveform 2002 and output waveform 2004 of the complete gate driver 100 at 200 kHz switching frequency. The input to output propagation delay 2102 and jitter 2200 are plotted vs. gate driver temperature 2104 in FIG. 21 and FIG. 22, respectively. The rise time 2302 and fall time 2304 of the gate driver's output are plotted in FIG. 23.

Figure 24:
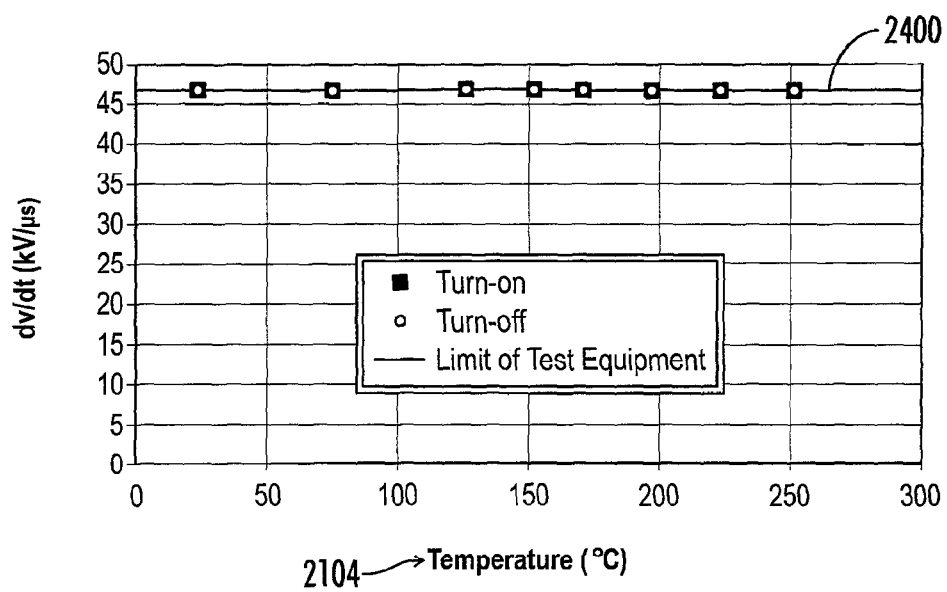
FIG. 24 is a chart of the Gate driver dv/dt noise immunity.

FIG. 24 shows dv/dt measurement 2400 for the gate driver from room temperature to 250° C. A high speed power transistor was utilized in a clamped inductive test in order to generate the dv/dt. The source output of the gate driver's secondary was connected to the drain of the transistor and the ground input of the driver's primary was connected to the source of the transistor. Both turn-on and turn-off states were glitch-free at the maximum dv/dt capability of the test circuit, 46.8 kV/μs.

Reference numerals used throughout the detailed description and the drawings correspond to the following elements:
gate driver 100
primary side block 102
transformer 104
secondary side block 106
drive signal 107
totem pole output 108
logic signals 201
logic level translator 202
step output signals 203
pulse width modulation conditioner 204
primary side modulator 206
isolated modulated signal 301
demodulator 302
secondary side logic signal 304
deadtime generator 306
output and complement signal set 308
level shifter 310
voltage step up/down circuit 400
pulse input signal 402
input inverter 403
hysteresis circuit 404
second inverter 405
buffer 406
hysteresis and buffer power supply 408
hysteresis transistor 409
translator power supply 410
inverting output signal 414
translator circuit 418
pulse width buffer 502
fault signal 504
conditioner latch 506
Conditioned output two 508
nor gate 510 or gate 512
or gate 514
nor gate 516
nor gate 518
conditioned output three 520
conditioned output four 522
Input three signal 530
conditioned output one 532
Input three clear signal 550
voltage controlled oscillator 600
modulator latch 604
primary modulated output 605
first differential output 606
second differential output 608,
third differential output 610,
fourth differential output 612
current source transistor 614
current-starved inverters 616
current sink transistor 618
modulator nor gates 620
remaining nor gate inputs 621
modulator buffers 622
first channel input waveform 702
second channel input waveform 704
modulator first output waveform 706
modulator second output waveform 708
oscillator carrier frequency 802
oscillator input voltage 803
oscillator temperature 804
demodulator circuit 900
demodulator input stage 902
demodulator first diode 904
demodulator second diode 906
demodulator third diode 908
demodulator fourth diode 910
parallel resistance 912
demodulated signal 913
inverter 914
capacitor 916
second passout connection 920
third passout connection 922
buffer 930
first passed signal 940
dead time generator circuit 1000
transistor level delay circuit 1100
of one of its delay cells respectively.
First dead time NOR gate 1002
Second dead time nor gate 1004
Dead time inverter 1006
First non-overlapping signal 1008
Second non-overlapping signal 1010
First delay circuit 1020
Second delay circuit 1022
Third delay circuit 1024
Fourth delay circuit 1026
First or gate 1030
Second or gate 1032
First deadtime buffer 1040
second deadtime buffer 1042
delay circuitry 1100
current-starved inverters 1102
internal capacitors 1104
level shifter circuit 1200
capacitor output 1202
capacitor output 1204
first level diode 1206
second level diode 1208
level power supply 1210
pulse width modulation logic 1300
error amplifier output 1302
leading-edge blanking signal 1304
oscillator node 1306
pulse width modulation oscillator 1400
high duty cycle square wave signal 1402
ramp signal 1404
first charging comparator 1406
second charging comparator 1408
current charging capacitor 1410
constant current source 1412
oscillator flip flop 1414
external current resistor 1416
is used to set the current level.
high-speed comparator circuit 1500
preamplifier 1502
latch 1504
postamplifier 150
self-biased differential amplifier 1508
comparator output buffer inverter 1510
overcurrent protection voltage translator circuit 1600
leading edge blanking circuit 1700
blanking flip-flop 1702
blanking comparator 1704
blanking capacitor 1706
undervoltage lockout circuit 1800
undervoltage comparator 1802
undervoltage output 1804
active pull-down circuit 1806
undervoltage node 1808
undervoltage reference input 1810
resistor divider input 1812
output buffer circuit 1900
output buffer capacitor 1902
output buffer resistor 1904
external source follower transistor 1908
follower capacitor 1910
high side output transistor 1912
follower resistor 1916
middle diode 1918
lower transistor 1914 is turned on
gate diode 1920
Gate driver input waveform 2002
Gate driver output waveform 2004
input to output propagation delay 2102
gate driver temperature 2104
jitter 2200
rise time 2302
fall time 2304
dv/dt measurement 2400

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A gate driver, comprising:
a primary side circuit generating a primary modulated output;
an isolation transformer accepting the primary modulated output and generating an isolated modulated signal;
a secondary side circuit accepting the isolated modulated signal and outputting a drive signal;
a totem pole output accepting the drive signal;
a logic level translator accepting an input voltage peak-to-peak value of three and one third volts to five volts; and
a hysteresis circuit connected to the logic level translator.

2. A gate driver, comprising:
a primary side circuit generating a primary modulated output;
an isolation transformer accepting the primary modulated output and generating an isolated modulated signal;
a secondary side circuit accepting the isolated modulated signal and outputting a drive signal;
a totem pole output accepting the drive signal; and
a pulse width modulation conditioner circuit including a nonoverlap protection circuit.

3. A gate driver, comprising:
a primary side circuit generating a primary modulated output
an isolation transformer accepting the primary modulated output and generating an isolated modulated signal;
a secondary side circuit accepting the isolated modulated signal and outputting a drive signal;
a totem pole output accepting the drive signal; and
a pulse width modulation conditioner circuit including a fault protection circuit.

4. A gate driver, comprising:
a primary side circuit generating a primary modulated output;
an isolation transformer accepting the primary modulated output and generating an isolated modulated signal;
a secondary side circuit accepting the isolated modulated signal and outputting a drive signal;
a totem pole output accepting the drive signal; and
a modulator including a voltage controlled oscillator.

5. The gate driver of claim 4, the voltage controlled oscillator further comprising:
a single-ended ring of current-starved inverters.

6. A gate driver, comprising:
a primary side circuit generating a primary modulated output;
an isolation transformer accepting the primary modulated output and generating an isolated modulated signal;
a secondary side circuit accepting the isolated modulated signal and outputting a drive signal;
a totem pole output accepting the drive signal;
a demodulator circuit including a full-wave rectifier and an external high pass filter connection; and
a buffer connected to a low pass filter connected to a second buffer.

7. A gate driver, comprising:
a primary side circuit generating a primary modulated output;
an isolation transformer accepting the primary modulated output and generating an isolated modulated signal;
a secondary side circuit accepting the isolated modulated signal and outputting a drive signal;
a totem pole output accepting the drive signal; and
a dead time generator including a first nor gate, a second nor gate, an inverter connected to the second nor gate, and delay circuitry including current-starved inverters separated by capacitors.

8. A gate driver, comprising:
a primary side circuit generating a primary modulated output;
an isolation transformer accepting the primary modulated output and generating an isolated modulated signal;
a secondary side circuit accepting the isolated modulated signal and outputting a drive signal;
a totem pole output accepting the drive signal; and
a discrete buffer circuit including a buffer capacitor; and
a buffer resistor connected to a follower junction gate field-effect transistor.

9. A gate driver, comprising:
a primary side circuit generating a primary modulated output;
an isolation transformer accepting the primary modulated output and generating an isolated modulated signal;
a secondary side circuit accepting the isolated modulated signal and outputting a drive signal;
a totem pole output accepting the drive signal;
a discrete buffer circuit including a buffer capacitor;
a buffer resistor connected to a follower junction gate field-effect transistor; and
the follower junction gate field-effect transistor connected by a follower capacitor in parallel with a follower resistor to the gate of an junction gate field-effect transistor; and
a middle diode connected to the source of the follower junction gate field-effect transistor; and
a gate diode connected from the gate of the junction gate field-effect transistor to the middle diode.

* * * * *